US006992537B2

(12) United States Patent
Yasui et al.

(10) Patent No.: US 6,992,537 B2
(45) Date of Patent: Jan. 31, 2006

(54) RECEIVER

(75) Inventors: Nobuhiko Yasui, Moriguchi (JP); Noboru Katta, Itami (JP); Takahisa Sakai, Amagasaki (JP); Yuji Mizuguchi, Hirakata (JP); Yutaka Takahira, Neyagawa (JP); Hirotsugu Kawada, Osaka (JP); Toshitomo Umei, Settsu (JP); Takashi Akita, Kadoma (JP); Osamu Shibata, Moriguchi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 235 days.

(21) Appl. No.: 10/468,829

(22) PCT Filed: Dec. 27, 2002

(86) PCT No.: PCT/JP02/13775

§ 371 (c)(1), (2), (4) Date: Aug. 22, 2003

(65) Prior Publication Data

US 2004/0155720 A1 Aug. 12, 2004

(51) Int. Cl.
*H03H 7/01* (2006.01)
*H03H 7/38* (2006.01)

(52) U.S. Cl. ............................................ 333/12; 333/32

(58) Field of Classification Search .................. 333/12, 333/22 R, 25, 32
See application file for complete search history.

(56) References Cited

U.S. PATENT DOCUMENTS 5,548,254 A * 8/1996 Ueno et al. .................. 333/25
6,677,829 B2 * 1/2004 Maki et al. ............... 333/22 R

FOREIGN PATENT DOCUMENTS

| | | |
|---|---|---|
| JP | 4-218214 | 8/1992 |
| JP | 9-247217 | 9/1997 |
| JP | 2002-261842 | 9/2002 |
| JP | 2003-18224 | 1/2003 |

* cited by examiner

*Primary Examiner*—Dean Takaoka
(74) *Attorney, Agent, or Firm*—Wenderoth, Lind & Ponack, L.L.P.

(57) ABSTRACT

A receiver includes a noise reduction circuit for eliminating noise from a differential signal transmitted through a differential transmission line, and a data recovery circuit for recovering data from a differential signal outputted from the noise reduction circuit. The noise reduction circuit includes common-mode chokes for reflecting common-mode noise superimposed on an input differential signal, and a common-mode noise reduction circuit for directing the common-mode noise reflected by the common-mode chokes to a low potential point of the common-mode noise reduction circuit.

9 Claims, 4 Drawing Sheets

FIG. 5 - PRIOR ART
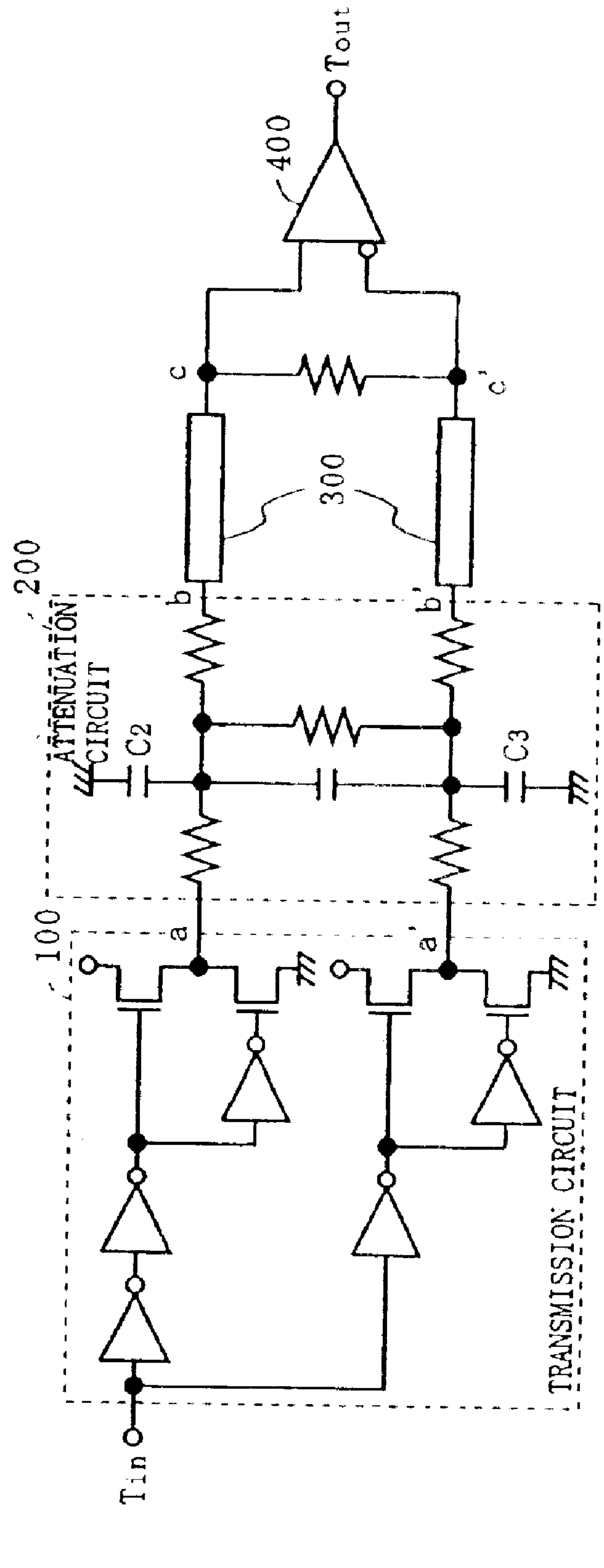

RECEIVER

TECHNICAL FIELD

The present invention relates to a receiver, and more particularly to a receiver for receiving a differential signal transmitted through a differential transmission line.

BACKGROUND ART

Referring to FIG. 5, a transfer circuit disclosed in Japanese Laid-Open Patent Publication No. 9-247217 is described below. In FIG. 5, a conventional transfer circuit includes a transmission circuit 100, an attenuation circuit 200, a transmission line pair 300, and a receiving circuit 400.

The transmission circuit 100 generates, from a transmission signal that is fed to an input terminal $T_{in}$ of the transmission circuit 100, complementary outputs a–a' having complementary logic levels, and the transmission circuit 100 provides the complementary outputs a–a' to the attenuation circuit 200.

The attenuation circuit 200 cuts off the received complementary outputs a–a' at a given frequency, and then attenuates the amplitude of each output. Further, the attenuation circuit 200 eliminates common-mode noise from the complementary outputs a–a' and outputs the complementary outputs a–a', as complementary outputs b–b', to the transmission line pair 300.

The complementary outputs b–b' are inputted, as complementary outputs c–c', to the receiving circuit 400, after having been transmitted through the transmission line pair 300. The receiving circuit 400 recovers a transmission signal from the received complementary outputs c–c' and outputs the transmission signal from an output terminal $T_{out}$.

Such a transfer circuit prevents, in the attenuation circuit 200, external common-mode noise from being superimposed on the complementary outputs b–b', by the combination of capacitances $C_2$ and $C_3$ and a balanced transmission T-type resistance attenuation circuit. Such a circuit, however, has a problem in that when common-mode noise is superimposed on the complementary outputs b–b' at any point after the transmission line pair 300, the receiving circuit 400 incorrectly recovers a received differential signal due to the superimposed common-mode noise.

Accordingly, an object of the present invention is to provide a receiver which is capable of properly recovering a received differential signal by eliminating common-mode noise.

SUMMARY OF THE INVENTION

To achieve the above-described object, the present invention has the following aspects.

A first aspect of the present invention is directed to a receiver for receiving differential signals. The receiver of the first aspect comprises a noise reduction circuit for eliminating noise from a differential signal that is transmitted through a differential transmission line, and a data recovery circuit for recovering data from a differential signal that is outputted from the noise reduction circuit. In the receiver, the noise reduction circuit may comprise common-mode chokes for reflecting common-mode noise that is superimposed on an input differential signal, and a common-mode noise reduction circuit for directing the common-mode noise that is reflected by the common-mode chokes to a low potential point of the common-mode noise reduction circuit.

The above-described noise reduction circuit may comprise at least a plurality of terminal resistors between the differential transmission line and the common-mode chokes and between the common-mode chokes and the data recovery circuit.

In addition, the above-described common-mode noise reduction circuit may comprise: first and second resistors as the plurality of terminal resistors, where the first and second resistors are connected in series with each other and in a parallel connection between the differential transmission line and the common-mode chokes; and third and fourth resistors, to both ends of which a power source voltage is applied, where the third and fourth resistors are connected in series with each other. In the common-mode noise reduction circuit, a node between the first and second resistors and a node between the third and fourth resistors may be connected to each other.

In such a configuration, the common-mode noise reduction circuit directs the common-mode noise that is reflected by the common-mode chokes to a low potential point, and therefore, it is possible to inhibit common-mode noise, which is possibly superimposed on a differential signal, from entering the data recovery circuit. Accordingly, a receiver which is capable of properly recovering a received differential signal can be provided.

Furthermore, the above-described noise reduction circuit may further comprise fifth and sixth resistors as the plurality of terminal resistors, where the fifth and sixth resistors are connected in series with each other and are in a parallel connection between the data recovery circuit and the common-mode chokes. In the noise reduction circuit, a node between the fifth and sixth resistors may be connected to the node between the third and fourth resistors. This further enables the common-mode noise reduction circuit to eliminate reflection from the data recovery circuit.

It is preferable that the first and second resistors and the fifth and sixth resistors be disposed adjacent to each other. This makes it possible to achieve good impedance matching between the differential transmission line and the noise reduction circuit.

It is more preferable that the combined resistance of the first and fifth resistors and the combined resistance of the second and sixth resistors have a value which is equivalent to an impedance of the differential transmission line. This makes it possible to achieve better impedance matching between the differential transmission line and the noise reduction circuit.

It is also preferable that the combined resistance in a case where the first and second resistors are connected in series with each other and the combined resistance in a case where the fifth and sixth resistors are connected in series with each other be each substantially twice the impedance of the differential transmission line. This makes it possible to achieve better impedance matching between the differential transmission line and the noise reduction circuit.

Moreover, the common-mode noise reduction circuit may comprise first and second resistors as the plurality of terminal resistors, where the first and second resistors are connected in series with each other and are in a parallel connection between the differential transmission line and the common-mode chokes. In the common-mode noise reduction circuit, a node between the first and second resistors may be grounded via a capacitance. In this configuration, the common-mode noise reduction circuit directs the common-mode noise that is reflected by the common-mode chokes to ground via the capacitance, and therefore it is possible to inhibit common-mode noise, which is possibly superimposed on a differential signal, from entering the data recovery circuit. Accordingly, a receiver which is capable of properly recovering a received differential signal can be provided.

The above-described noise reduction circuit may further comprise: third and fourth resistors as the plurality of terminal resistors, where the third and fourth resistors are connected in series with each other and are in a parallel connection between the data recovery circuit and the common-mode chokes; and a power supply circuit, to which a power source voltage is applied, where the power supply circuit comprises fifth and sixth resistors which are connected in series with each other. In the noise reduction circuit, a node between the third and fourth resistors may be connected to a node between the fifth and sixth resistors. This enables the power supply circuit to eliminate reflection from the data recovery circuit.

It is preferable that the first and second resistors and the third and fourth resistors be disposed adjacent to each other. This makes it possible to achieve good impedance matching between the differential transmission line and the noise reduction circuit.

It is more preferable that the combined resistance of the first and third resistors and the combined resistance of the second and fourth resistors have a value which is equivalent to an impedance of the differential transmission line. This makes it possible to achieve better impedance matching between the differential transmission line and the noise reduction circuit.

It is also preferable that the combined resistance in a case where the first and second resistors are connected in series with each other and the combined resistance in a case where the third and fourth resistors are connected in series with each other be each substantially twice the impedance of the differential transmission line. This makes it possible to achieve better impedance matching between the differential transmission line and the noise reduction circuit.

BRIEF DESCRIPTION OF THE DRAWINGS

FIG. 5 is a schematic diagram illustrating the configuration of a conventional transfer circuit.

DETAILED DESCRIPTION OF THE INVENTION

Figure 1:
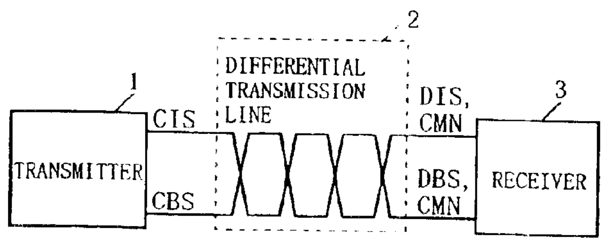
FIG. 1 is a block diagram illustrating the entire configuration of a transmission system that includes a receiver 3 according to one embodiment of the present invention.

FIG. 1 is a block diagram illustrating the configuration of a transmission system that includes a receiver 3 according to one embodiment of the present invention. In FIG. 1, the transmission system includes, in addition to the receiver 3, a transmitter 1 and a differential transmission line 2.

Figure 2:
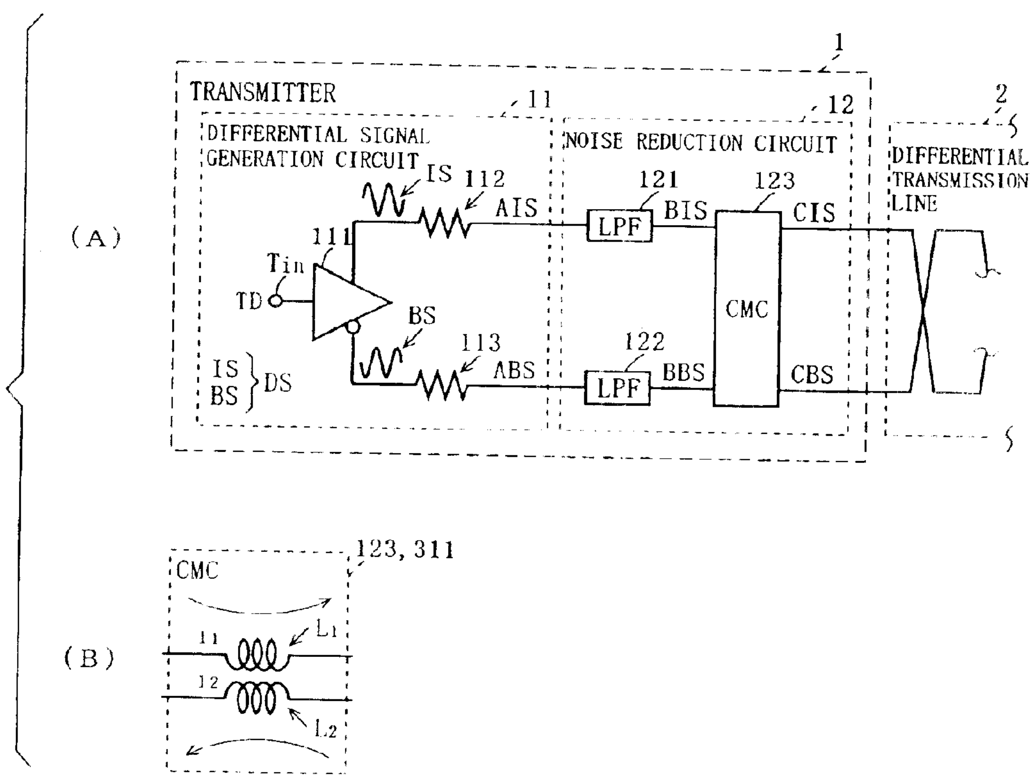
FIG. 2 is a schematic diagram illustrating the specific circuit configuration of a transmitter 1 in FIG. 1.

The transmitter 1 includes, as shown in (A) of FIG. 2, a differential signal generation circuit 11 and a noise reduction circuit 12.

The differential signal generation circuit 11 includes a driver 111 and two resistors 112 and 113.

The driver 111 has an input terminal $T_{in}$. Data TD to be transmitted to the receiver 3 is inputted to the input terminal $T_{in}$. The driver 111 generates an in-phase signal IS from the input data TD and outputs the in-phase signal IS from one of the terminals. In addition, the driver 111 generates a reverse-phase signal BS from the same input data TD and outputs the reverse-phase signal BS from the other terminal. The in-phase signal IS and the reverse-phase signal BS have voltage waveforms, which are substantially symmetric to each other with reference to a given voltage value. In other words, the reverse-phase signal BS has a shape such that the in-phase signal IS is substantially inverted with reference to the given voltage value. The in-phase signal IS and the reverse-phase signal BS, such as those described above, together constitute a differential signal DS.

Input terminals of the resistors 112 and 113 are respectively connected to one output terminal and the other output terminal of the driver 111. The resistor 112 attenuates, according to the resistance thereof, the amplitude of the in-phase signal IS, which has been outputted from the driver 111, and generates and outputs an in-phase signal AIS. The resistor 113 has substantially the same resistance as the resistor 112, and attenuates the amplitude of the reverse-phase signal BS, which has been outputted from the driver 111, and generates and outputs a reverse-phase signal ABS. The above-described resistors 112 and 113 provide impedance matching between the driver 111 and the differential transmission line 2, and further keep the gain of the driver 111 constant.

The noise reduction circuit 12 includes two low-pass circuits (hereinafter referred to as LPFs (Low Pass Filters)) 121 and 122 and Common-Mode Chokes (hereinafter referred to as CMC) 123.

An input terminal of the LPF 121 is connected to an output terminal of the resistor 112. The LPF 121 has given cut-off characteristics, and eliminates harmonics from the in-phase signal AIS, which has been outputted from the resistor 112. In addition, on the input in-phase signal AIS, differential and common-mode noise, each having a high frequency, is possibly superimposed. The LPF 121 eliminates such differential and common-mode noise from the input in-phase signal AIS. By this process, the LPF 121 generates and outputs an in-phase signal BIS.

An input terminal of the LPF 122 is connected to an output terminal of the resistor 113. The LPF 122 has substantially the same cut-off characteristics as the LPF 121, and eliminates harmonics, which are possibly generated by the driver 111, and differential and common-mode noise, which may possibly be superimposed externally, from the reverse-phase signal ABS having been outputted from the resistor 113, and generates and outputs a reverse-phase signal BBS.

The CMC 123 typically includes, as shown in (B) of FIG. 2, two inductances $L_1$ and $L_2$. Input terminals of the inductances $L_1$ and $L_2$ are connected to output terminals of the LPFs 121 and 122, respectively. The inductances $L_1$ and $L_2$ are wound in opposite directions and with the same number of turns, and when a current $i_1$ or $i_2$ is applied to one of the inductances, the currents $i_1$ and $i_2$ being in the same direction, a voltage is induced in the other inductance, $L_2$ or $L_1$, due to mutual inductance, and the voltages which are induced in the inductances are in opposite directions, as shown by the arrows. The in-phase signal BIS from the LPF 121 is fed to the inductance $L_1$, and the reverse-phase signal BBS from the LPF 122 is fed to the inductance $L_2$. When the in-phase signal BIS and the reverse-phase signal BBS, whose time waveforms are symmetric to each other, are inputted to the CMC 123, voltages in the same direction are induced, and therefore, the CMC 123 allows the in-phase signal BIS and the reverse-phase signal BBS to pass therethrough and outputs the signals BIS and BBS as an in-phase signal CIS and a reverse-phase signal CBS.

Meanwhile, on the in-phase signal BIS and the reverse-phase signal BBS, common-mode noise, which has not been eliminated by the LPFs 121 and 122, may be superimposed. In addition, common-mode noise may be superimposed on the in-phase signal BIS and the reverse-phase signal BBS after having been outputted from the LPFs 121 and 122. The common-mode noises which are present on both of the signals BIS and BBS have the same-phase relationship. Upon input of common-mode noise, the impedance of the CMC 123 becomes higher than those of the LPFs 121 and 122, and the CMC 123 reflects the common-mode noise on the signals FIS and FBS toward the sides of the LPFs 121 and 122. Thereby, the CMC 123 generates the in-phase signal CIS and the reverse-phase signal CBS, from which the common-mode noise has been eliminated, and outputs the signals CIS and CBS, respectively, to the two lines that form the differential transmission line 2. By the noise reduction circuit 12 described above, the transmitter 1 prevents the above-described various types of noise from entering the differential transmission line 2.

In FIG. 1, the differential transmission line 2 is typically a twisted pair cable. One of the lines of the differential transmission line 2 transmits the input in-phase signal CIS and the other line transmits the input reverse-phase signal CBS. These signals are received, as an in-phase signal DIS and a reverse-phase signal DBS, by the receiver 3. Here, on the in-phase signal DIS and the reverse-phase signal DBS, common-mode noise CMN may be superimposed over the differential transmission line 2.

Figure 3:
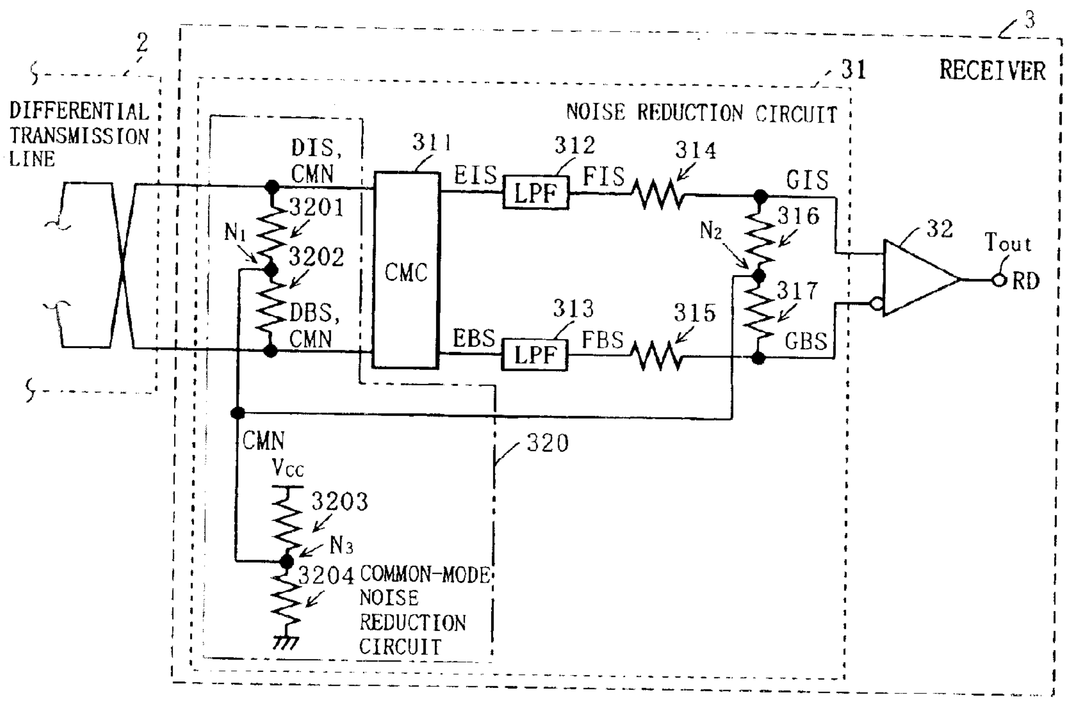
FIG. 3 is a schematic diagram illustrating the specific circuit configuration of the receiver 3 in FIG. 1.

The receiver 3 includes, as shown in FIG. 3, a noise reduction circuit 31 and a data recovery circuit 32.

The noise reduction circuit 31 includes a CMC 311, two LPFs 312 and 313, two terminal resistors 314 and 315, and a common-mode noise reduction circuit 320. The common-mode noise reduction circuit 320 includes two terminal resistors 3201 and 3202 and two resistors 3203 and 3204.

The CMC 311 includes inductances $L_1$ and $L_2$, as described above (see (B) of FIG. 2). Input terminals of the inductances $L_1$ and $L_2$ are respectively connected to one line and the other line of the differential transmission line 2.

The LPFs 312 and 313 have substantially the same cut-off characteristics, and an input terminal of each of the LPFs 312 and 313 is connected to an output terminal of each of the inductances $L_1$ and $L_2$ in the CMC 311. In addition, output terminals of the LPFs 312 and 313 are connected to one input terminal and the other input terminal of the data recovery circuit 32, respectively, as will be described later.

The two terminal resistors 314 and 315 have substantially the same resistances $R_4$ and $R_5$, and are connected in series with each other. One end of this series circuit is connected between the LPF 312 and one of the input terminals of the data recovery circuit 32, and the other end of this series circuit is connected between the LPF 313 and the other input terminal of the data recovery circuit 32. Further, a node (i.e., a voltage neutral point) $N_2$ between these terminal resistors 314 and 315 is connected to a node (i.e., a voltage neutral point) $N_3$ of the common-mode noise reduction circuit 320, as will be described later.

In the common-mode noise reduction circuit 320, the terminal resistors 3201 and 3202 have substantially the same resistances $R_{01}$ and $R_{02}$, are connected in series with each other and are in a parallel connection between the differential transmission line 2 and the CMC 311. Further, a node (i.e., a voltage neutral point) $N_1$ between the terminal resistors 3201 and 3202 is connected to the node $N_3$ of the common-mode noise reduction circuit 320, as will be described later.

Here, the impedance of the CMC 311 is denoted as $Z_c$ and the combined resistance of the terminal resistors 3201 and 3202 is denoted as $Z_{R1}$ (=$R_{01}//R_{02}$). In addition, the frequency band of the common-mode noise CMN is denoted as $f_1$. With this assumption, $Z_c$ and $Z_{R1}$, in the frequency band $f_1$, take values that satisfy the condition $Z_c >> Z_{R1}$. Thereby, it becomes possible to prevent the common-mode noise CMN from entering the data recovery circuit 32, the details of which will be described later.

Furthermore, the two resistors 3203 and 3204 have the same resistance and are connected in series with each other. One end of such a series circuit is connected to a power source, which is not shown in the figure, and the other end is connected to ground. In addition, the node $N_3$ between the resistors 3203 and 3204 is connected to both of the above-described nodes $N_1$ and $N_2$.

The common-mode noise CMN, which is superimposed on each of the signals DIS and DBS, may be inputted to the noise reduction circuit 31 having the above-described configuration, in addition to the in-phase signal DIS and the reverse-phase signal DBS. Here, the in-phase signal DIS and the reverse-phase signal DBS have substantially symmetric time waveforms. Accordingly, upon the input of the signals DIS and DBS, the CMC 311 allows the signals DIS and DBS to pass therethrough and outputs the signals DIS and DBS as an in-phase signal EIS and a reverse-phase signal EBS, as in the case of the CMC 123.

The LPFs 312 and 313 remove high-frequency components from the output in-phase signal EIS and the output reverse-phase signal EBS in the CMC 311, and generate and output an in-phase signal FIS and a reverse-phase signal FBS. The output in-phase signal FIS is terminated by the terminal resistor 314 and is fed, as an in-phase signal GIS, to one of the input terminals of the data recovery circuit 32. In addition, the output reverse-phase signal FBS is terminated by the terminal resistor 315 and is fed, as a reverse-phase signal GBS, to the other input terminal of the data recovery circuit 32.

The data recovery circuit 32 recovers data RD by taking the difference between the input in-phase signal GIS and the input reverse-phase signal GBS, and outputs the recovered data RD from an output terminal $T_{OUT}$.

Since the potential of the node $N_3$ becomes lower than the potential of the node $N_2$, reflected waves, which may possibly return to the noise reduction circuit 31 from the data recovery circuit 32, are directed to the ground of the common-mode noise reduction circuit 320.

The common-mode noise CMN, which may possibly be superimposed on the in-phase signal DIS and the common-mode noise CMN, which may possibly be superimposed on the reverse-phase signal DBS, have the same phase. In this case, the CMC 311 reflects the common-mode noise CMN, as in the case of the CMC 123. The reflected waves increase the potential immediately before the CMC 311. In addition, since the ground potential of the common-mode noise reduction circuit 320 is lower than the ground potential of the node $N_1$, the reflected waves (i.e., the common-mode noise CMN) of the CMC 311 are directed to the ground of the common-mode noise reduction circuit 320 from the node $N_1$ via the node $N_3$.

In more detail, when the current value of the common-mode noise CMN (frequency band $f_1$) is denoted as $i_N$, the current value $i_R$, which is applied to the terminal resistors 3201 and 3202, is expressed by the following equation (1):

$$i_R = i_N \cdot \frac{Z_C + (R_4 // R_5)}{(R_{01} // R_{02}) + (Z_C + R_4 // R_5)} \quad (1)$$

where $Z_c$ represents, as described above, the impedance of the CMC 311, and $R_{01}//R_{02}$ and $R_4//R_5$ are expressed by the following equations (2) and (3):

$$R_{01} // R_{02} = \frac{R_{01} \cdot R_{02}}{R_{01} + R_{02}} \quad (2)$$

$$R_4 // R_5 = \frac{R_4 \cdot R_5}{R_4 + R_5} \quad (3)$$

Moreover, the current $i_D$, which is applied to the data recovery circuit 32, is expressed by the following equation (4):

$$i_D - i_N \cdot \frac{R_{01} // R_{02}}{(R_{01} // R_{02}) + (Z_C + R_4 // R_5)} \quad (4)$$

Accordingly, in the frequency band $f_1$, when $Z_c >> Z_{R1}$ ($=R_{01}//R_{02}$), $i_R >> i_D$. That is, a large part of the common-mode noise CMN enters the common-mode noise reduction circuit 320 and only a small amount of noise enters the data recovery circuit 32. Thus, in the data recovery circuit 32, misidentification that is caused by the common-mode noise CMN is reduced. In addition, it is also possible to prevent the common-mode noise CMN from returning to the differential transmission line 2.

It is preferable that the terminal resistors 3201 and 3202 and the terminal resistors 314 and 315 be disposed as close as possible to each other. Doing so makes it possible to achieve good impedance matching between the differential transmission line 2 and the noise reduction circuit 31.

As is also clear from FIG. 3, the terminal resistors 3201 and 314 are connected so as to be parallel with each other, and the terminal resistors 3202 and 315 are connected so as to be parallel with each other. The combined resistance of such terminal resistors 3201 and 314 is denoted as $Z_{R2}$ ($=R_{01}//R_4$), and the combined resistance of such terminal resistors 3202 and 315 is denoted as $Z_{R3}$ ($=R_{02}//R_5$). $R_{01}//R_4$ and $R_{02}//R_5$ are expressed by the following equations (5) and (6):

$$R_{01} // R_4 = \frac{R_{01} \cdot R_4}{R_{01} + R_4} \quad (5)$$

$$R_{02} // R_5 = \frac{R_{02} \cdot R_5}{R_{02} + R_5} \quad (6)$$

Furthermore, the impedance of the differential transmission line 2 is denoted as $Z_{DT}$. In this assumption, it is preferable to substantially satisfy $Z_{R2}=Z_{R3}=Z_{DT}$. Thereby, it is possible to achieve better impedance matching between the differential transmission line 2 and the noise reduction circuit 31.

Moreover, the combined resistance in the case where the terminal resistors 314 and 315 are connected in series with each other is denoted as $Z_{R4}$ ($=R_4//_{R5}$). In this case, it is theoretically more preferable that the resistances $R_{01}$, $R_{02}$, $R_4$, and $R_5$ take values that satisfy the relation $Z_{R1}=Z_{R4}=2 \cdot Z_{DT}$. Thereby, it is possible to achieve better impedance matching between the differential transmission line 2 and the noise reduction circuit 31.

In the above description, the LPFs 312 and 313 are disposed behind (downstream from) the CMC 311, but the configuration is not limited thereto; the LPFs 312 and 313 may be disposed before (upstream from) the CMC 311.

Figure 4:
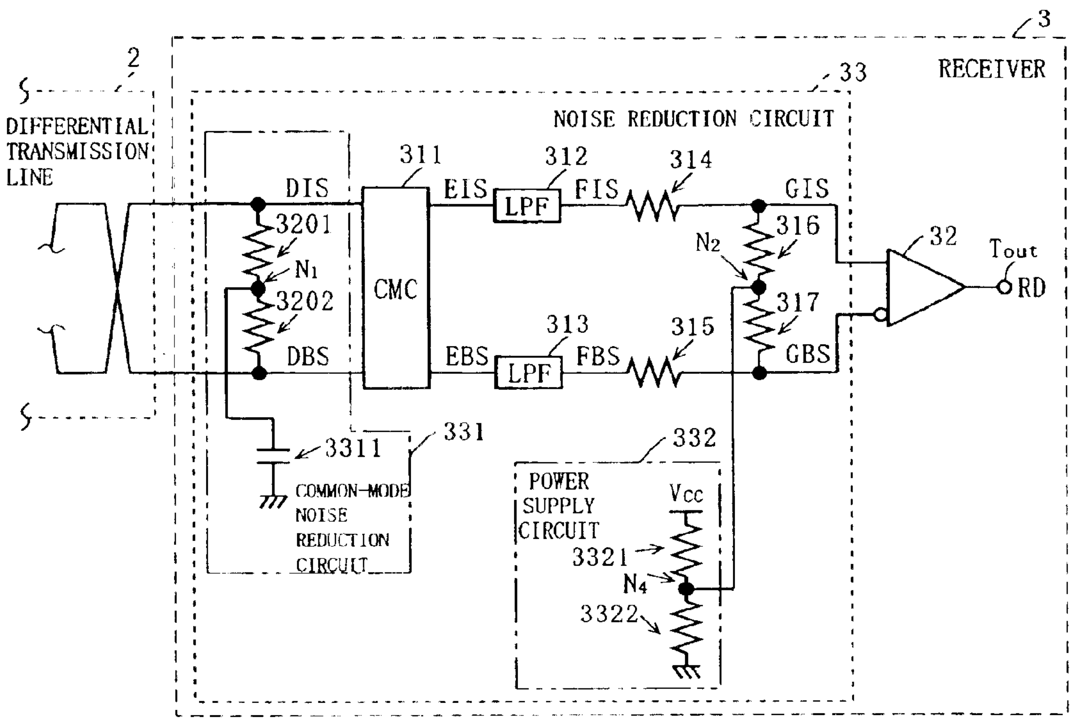
FIG. 4 is a schematic diagram illustrating a variant of a noise reduction circuit 31 in FIG. 3 (a noise reduction circuit 33).

FIG. 4 is a schematic diagram illustrating the configuration of a noise reduction circuit 33, a variant of the above-described noise reduction circuit 31. In FIG. 4, the noise reduction circuit 33 is different from the noise reduction circuit 31 in that instead of the common-mode noise reduction circuit 320, a common-mode noise reduction circuit 331 and a power supply circuit 332 are included. Except for this, there is no difference between the noise reduction circuits 31 and 33; therefore, in FIG. 4, the elements corresponding to those in FIG. 3 are designated by like reference numerals and the description thereof is omitted.

The common-mode noise reduction circuit 331 is different from the common-mode noise reduction circuit 320 in that instead of the resistors 3203 and 3204, a capacitance 3311 is included. Except for this, there is no difference between the common-mode noise reduction circuits 320 and 331. Therefore, in FIG. 4, the elements corresponding to those in FIG. 3 are designated by like reference numerals and the description thereof is omitted.

The capacitance 3311 has a predetermined capacitance, and one end of the capacitance is connected to a node $N_1$ and the other end of the capacitance 3311 is connected to ground.

The power supply circuit 332 includes two resistors 3321 and 3322. The resistors 3321 and 3322 have the same resistance, and are connected in series with each other. One end of such a series circuit is connected to a power source, which is not shown in the figure, and the other end of this series circuit is connected to ground. In addition, a node (i.e., a voltage neutral point) $N_4$ between the resistors 3321 and 3322 is connected to the above-described node $N_2$.

By such a noise reduction circuit 33, common-mode noise CMN can also be eliminated, as in the case of the above-described noise reduction circuit 31. Meanwhile, in the noise reduction circuit 31, when a wideband differential signal DS is transmitted, the potential of the node $N_1$ fluctuates. In addition, in the noise reduction circuit 31, the nodes $N_1$ and $N_2$ are ultimately connected to each other, and thus the potential fluctuation on the node $N_1$ is propagated to the node $N_2$. Consequently, the noise reduction circuit 31 was sometimes unable to finely eliminate reflection from the data recovery circuit 32.

On the other hand, in the noise reduction circuit 33, since there is no direct connection between the nodes $N_1$ and $N_2$, the potential fluctuation on the node $N_1$ is not propagated to the node $N_2$. Thus, reflection from the data recovery circuit 32 can be finely eliminated by the power supply circuit 332.

Industrial Applicability

A receiver of the present invention can be applied to a transfer circuit that transmits and receives differential signals.

What is claimed is:

1. A receiver for receiving differential signals, said receiver comprising:

- a noise reduction circuit for eliminating noise from a differential signal transmitted through a differential transmission line; and
- a data recovery circuit for recovering data from a differential signal outputted from said noise reduction circuit, wherein said noise reduction circuit comprises:

- common-mode chokes for reflecting common-mode noise superimposed on an input differential signal; and a common-mode noise reduction circuit for directing the common-mode noise reflected by said common-mode chokes to a low potential point of said common-mode noise reduction circuit, said common-mode noise reduction circuit comprising a plurality of terminal resistors between the differential transmission line and said common-mode chokes and between said common-mode chokes and said data recovery circuit;

wherein said common-mode noise reduction circuit comprises:

first and second resistors as said plurality of terminal resistors, said first and second resistors being connected in series with each other and in a parallel connection between the differential transmission line and said common-mode chokes; and third and fourth resistors to which a power source voltage is applied, said third and fourth resistors being connected in series with each other; and wherein a node between said first and second resistors and a node between said third and fourth resistors are connected to each other.

2. The receiver according to claim 1, wherein said noise reduction circuit further comprises fifth and sixth resistors as said plurality of terminal resistors, said fifth and sixth resistors being connected in series with each other and in a parallel connection between said data recovery circuit and said common-mode chokes, wherein a node between said fifth and sixth resistors is connected to said node between said third and fourth resistors.

3. The receiver according to claim 2, wherein said first and second resistors and said fifth and sixth resistors are disposed adjacent to each other.

4. The receiver according to claim 3, wherein the combined resistance of said first and fifth resistors and the combined resistance of said second and sixth resistors have a value which is equivalent to an impedance of the differential transmission line.

5. The receiver according to claim 3, wherein the combined resistance in a case where said first and second resistors are connected in series with each other and the combined resistance in a case where said fifth and sixth resistors are connected in series with each other, are each substantially twice the impedance of the differential transmission line.

6. A receiver for receiving differential signals, said receiver comprising:

a noise reduction circuit for eliminating noise from a differential signal transmitted through a differential transmission line; and a data recovery circuit for recovering data from a differential signal outputted from said noise reduction circuit, wherein said noise reduction circuit comprises:

common-mode chokes for reflecting common-mode noise superimposed on an input differential signal;

a common-mode noise reduction circuit for directing the common-mode noise reflected by said common-mode chokes to a low potential point of said common-mode noise reduction circuit, said common-mode noise reduction circuit comprising a first plurality of terminal resistors between the differential transmission line and said common-mode chokes; and a second plurality of terminal resistors between said common-mode chokes and said data recovery circuit;

wherein said common-mode noise reduction circuit comprises first and second resistors as said first plurality of terminal resistors, said first and second resistors being connected in series with each other and in a parallel connection between the differential transmission line and said common-mode chokes;

wherein a node between said first and second resistors is grounded via a capacitance;

wherein said noise reduction circuit further comprises:

third and fourth resistors as said second plurality of terminal resistors, said third and fourth resistors being connected in series with each other and in a parallel connection between said data recovery circuit and said common-mode chokes; and a power supply circuit, to which a power source voltage is applied, said power supply circuit comprising fifth and sixth resistors connected in series with each other; and wherein a node between said third and fourth resistors is connected to a node between said fifth and sixth resistors.

7. The receiver according to claim 6, wherein said first and second resistors and said third and fourth resistors are disposed adjacent to each other.

8. The receiver according to claim 7, wherein the combined resistance of said first and third resistors and the combined resistance of said second and fourth resistors have a value which is equivalent to an impedance of the differential transmission line.

9. The receiver according to claim 7, wherein the combined resistance in a case where said first and second resistors are connected in series with each other and the combined resistance in a case where said third and fourth resistors are connected in series with each other, are each substantially twice the impedance of the differential transmission line.

* * * * *